United States Patent
Huang et al.

(10) Patent No.: US 9,922,803 B2
(45) Date of Patent: Mar. 20, 2018

(54) PLASMA PROCESSING DEVICE

(71) Applicants: Chi-Hsien Huang, Kwei-Shan Tao-Yuan (TW); Chao-Sung Lai, Kwei-Shan Tao-Yuan (TW); Chien Chou, Kwei-Shan Tao-Yuan (TW); Chu-Fa Chan, New Taipei (TW)

(72) Inventors: Chi-Hsien Huang, Kwei-Shan Tao-Yuan (TW); Chao-Sung Lai, Kwei-Shan Tao-Yuan (TW); Chien Chou, Kwei-Shan Tao-Yuan (TW); Chu-Fa Chan, New Taipei (TW)

(73) Assignee: CHANG GUNG UNIVERSITY, Tao-Yuan (TW)

( * ) Notice: Subject to any disclaimer, the term of this patent is extended or adjusted under 35 U.S.C. 154(b) by 442 days.

(21) Appl. No.: 13/653,642

(22) Filed: Oct. 17, 2012

(65) Prior Publication Data
US 2014/0060740 A1    Mar. 6, 2014

(30) Foreign Application Priority Data
Aug. 30, 2012    (TW) .................. 101131580

(51) Int. Cl.
*H01L 21/00*    (2006.01)
*H01J 37/32*    (2006.01)
*C23C 16/455*   (2006.01)

(52) U.S. Cl.
CPC .. *H01J 37/32091* (2013.01); *C23C 16/45565* (2013.01); *H01J 37/32082* (2013.01); *H01J 37/32357* (2013.01); *H01J 37/32422* (2013.01); *H01J 37/32633* (2013.01)

(58) Field of Classification Search
CPC ................................. H01J 37/32422
USPC ...................................... 118/723 ER
See application file for complete search history.

(56) References Cited

U.S. PATENT DOCUMENTS

| | | | | | |
|---|---|---|---|---|---|
| 4,792,378 | A | * | 12/1988 | Rose et al. ................. | 438/706 |
| 6,110,556 | A | * | 8/2000 | Bang et al. ................ | 428/64.1 |
| 6,238,527 | B1 | * | 5/2001 | Sone ................... | C23C 14/0047 |
| | | | | | 204/192.12 |
| 6,581,384 | B1 | * | 6/2003 | Benson ......................... | 60/653 |
| 6,830,786 | B2 | * | 12/2004 | Yuda et al. ................... | 427/579 |
| 6,851,384 | B2 | * | 2/2005 | Yuda ..................... | C23C 16/402 |
| | | | | | 118/723 ER |
| 6,886,491 | B2 | * | 5/2005 | Kim et al. ................ | 118/723 E |
| 7,306,829 | B2 | * | 12/2007 | Turlot et al. ................ | 427/569 |
| 7,942,969 | B2 | * | 5/2011 | Riker ............... | H01J 37/32357 |
| | | | | | 118/715 |
| 2004/0219737 | A1 | * | 11/2004 | Quon .......................... | 438/222 |

(Continued)

*Primary Examiner* — Parviz Hassanzadeh
*Assistant Examiner* — Michelle Crowell
(74) *Attorney, Agent, or Firm* — Bacon & Thomas, PLLC

(57) ABSTRACT

The invention provides a plasma processing device, wherein the upper electrode and the lower electrode are in the vacuum chamber. The chip is placed in the lower electrode. The first plate is placed between the upper electrode and the lower electrode, and the first plate includes a plurality of first voids. The second plate is placed between the first plate and the lower electrode, and the second plate includes a plurality of second voids. The high frequency power is provided by the upper electrode and the lower electrode in the vacuum chamber, and the plasma is generated between the third plate and the upper electrode. The plasma is filtered by the third void, the first void, and the second void.

1 Claim, 9 Drawing Sheets

(56) References Cited

U.S. PATENT DOCUMENTS

| | | | |
|---|---|---|---|
| 2006/0019039 A1* | 1/2006 | Hanawa et al. | 427/523 |
| 2008/0268645 A1* | 10/2008 | Kao et al. | 438/694 |
| 2009/0008034 A1* | 1/2009 | Tahara | H01J 37/321 |
| | | | 156/345.35 |
| 2010/0096367 A1* | 4/2010 | Jeon et al. | 219/121.36 |
| 2010/0209704 A1* | 8/2010 | Yamazaki et al. | 428/368 |
| 2012/0021561 A1* | 1/2012 | Terakawa | C23C 14/3414 |
| | | | 438/98 |
| 2012/0238102 A1* | 9/2012 | Zhang | H01J 37/32422 |
| | | | 438/718 |
| 2013/0081761 A1* | 4/2013 | Sawada | H01J 37/32422 |
| | | | 156/345.3 |

* cited by examiner

PLASMA PROCESSING DEVICE

BACKGROUND OF THE INVENTION

1. Field of the Invention

This invention relates to a plasma processing device and plasma processing method thereof, and particularly to a plasma processing device having the upper plate and the lower plate and plasma processing method thereof.

2. Description of the Prior Art

The plasma has already been widely applied to various fields, such as the semiconductor integrated circuit industry. The growth of film from different material and the etching of circuit are achieved by the plasma technology generally. In addition, as for the semiconductor packaging, the plasma is used to wash and change the material surface, in order to achieve special function and effect.

As for an example, the plasma processing device is used for washing the chip. Conventionally, a great amount of water is required for washing the chip in the semiconductor process. The semiconductor process moves towards the miniaturized process gradually. The requirement for the cleanliness of chip itself is raised constantly. Accompany with deeper and longer groove on the chip, the wet etching is hard to be used because of its congenital shortcoming. The dry etching has become better solution at present gradually.

The plasma processing device can be used for dry cleaning. The plasma cleaning principle is similar to the plasma etching. The high frequency power is provided by the electrode to ionize the gas into the plasma. This plasma impacts the chip surface to remove the polluted particles from its surface, and then achieves the goal of cleaning. Similarly, this plasma can also etch or film the chip surface for pretreatment. The above-mentioned plasma has been applied to the process of IC packaging and the liquid crystal module widely at present.

However, the plasma itself has relatively high destruction ability, which is apt to damage the chip or chip surface in cleaning process. Therefore, as for the example of common downstream plasma device and remote plasma device, the improvement way is to increase the distance between the chip and the plasma, in order to reduce the destruction of chip surface by the plasma directly.

The integrated circuit has already been developed to the complicated device gradually. The advancement of chip design needs faster circuit system and more intensive circuit density. Because the speed of circuit and number of executable function will increase with the density of circuit structure, the circuit density will play an important role. The factors affecting the speed of integrated circuit and the design characteristics of circuit density include the resistance and thickness of material. This material is used to form the circuit structure layer on the substrate.

The metal material is applied to design the circuit structure, such as similar structure, such as the metal line, channel, and electrode etc. The metal structure is very important to the function of integrated circuit. The material with low resistance coefficient has good ability to inhibit the permeation of poly-silicon. This makes that the physical property of material with low resistance coefficient still be able to be maintained in substrate process and device use.

In order to reach the highest circuit density, the thickness of metal layer with low resistance coefficient has to be reduced in the circuit structure. But in the process, it shall be careful to avoid damaging those thin layers. The damaged thin layer will cause the poor circuit structure and increase the rejected rate of substrate. The growth of film and etching of circuit can be achieved by the plasma technique generally. The etching process is apt to damage the thin layer. The plasma can be used for strengthening the effect of etching. However, maintaining the steady plasma will cause the increase of ions impacting the substrate surface, and damage the circuit on the substrate.

Therefore, it is necessary to provide a plasma processing device and plasma processing method thereof, in order to improve the damage of chip or wafer by the plasma processing device.

SUMMARY OF THE INVENTION

The main purpose of the present invention is to provide a plasma processing device, which comprises a vacuum chamber, an upper electrode, a lower electrode, a high frequency power unit, a first plate, a second plate and a third plate. The upper electrode and the lower electrode are in the vacuum chamber. The chip is placed in the lower electrode. The high frequency power unit provides the high frequency power to the upper electrode and the lower electrode in the vacuum chamber.

The first plate of the present invention is placed between the upper electrode and the lower electrode, and the first plate includes a plurality of first voids. The second plate is placed between the first plate and the lower electrode, and the second plate includes a plurality of second voids. The third plate is placed on the surface of first plate relative to the upper electrode, and the third plate includes a plurality of third voids. The third voids are placed relative to the first voids.

There is a vacuum state inside the vacuum chamber of the present invention. The plasma is generated between the upper electrode and the third plate. The plasma if filtered by the third void, the first void, and the second void. The filtered plasma is used to process the semiconductor chip.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

In order to further understand the features and the technical contents of the present invention, please refer to the following detail description of invention and attached Figures. The attached Figures are only used for the reference and description, which are not used to limit the present invention.

In order to understand the present invention clearly, the thickness of layer and area has been magnified, in the figures. The same symbol represents the same device in all figures. It has to understand when a device (such as layer, area or substrate) placed "on" another device, this device may be directly placed on other device, or there may be middle device. On the contrary, when a device is "directly placed" "on" another device, it means that there is no middle device.

Figure 1A:
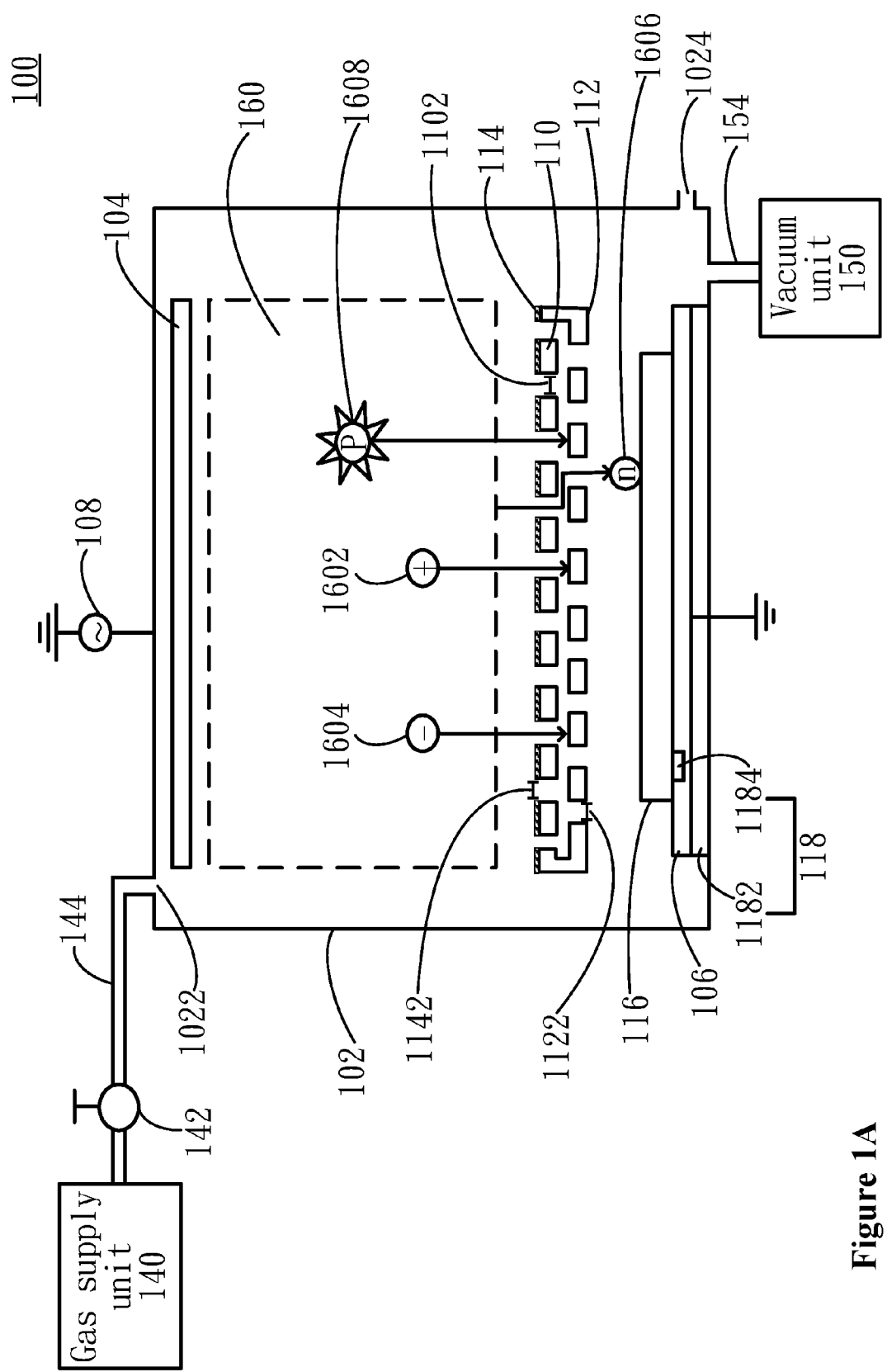
FIG. 1A shows the side view of the plasma processing device in accordance with an embodiment of the present invention.

Please refer to FIG. 1A, which shows the side view of the plasma processing device in accordance with an embodiment of the present invention. The present invention provides a plasma processing device 100, which comprises a vacuum chamber 102, an upper electrode 104, a lower electrode 106, a high frequency power unit 108, a first plate 110, a second plate 112 and a third plate 114. In this embodiment, the upper electrode 104 is placed at the top of vacuum chamber 102. The lower electrode 106 is placed at the bottom of vacuum chamber 102 relative to the upper electrode 104. The plasma processing device 100 is a cylindrical grounded airtight processing container. The semiconductor chip 116 is placed in the lower electrode 106, which means that the lower electrode 106 is also used as the platform of the semiconductor chip 116. The lower electrode 106 utilizes the temperature regulation unit 118 to maintain a predetermined temperature, wherein the temperature regulation unit 118 includes a heating unit 1182 and a temperature measurement unit 1184.

As shown in FIG. 1A, the vacuum chamber 102 has an upper electrode 104 placed at its top, and a lower electrode 106 placed at its bottom. The high frequency power unit 108 provides the high frequency power to the upper electrode 104 in the vacuum chamber 102. The vacuum chamber 102 is grounded via the lower electrode 106. In this embodiment, though the high frequency power unit 108 will only apply the high frequency power to the upper electrode 104, it can also apply the high frequency power to the lower electrode 106. The first plate 110, the second plate 112 and the third plate 114 are placed between the upper electrode 104 and the lower electrode 106.

As shown in FIG. 1A, the plasma processing device 100 further includes a gas inlet 1022 and a gas exit 1024. The gas inlet 1022 is placed at the top of vacuum chamber 102, and the gas exit 1024 is placed at the bottom of vacuum chamber 102 relative to the gas inlet 1022, so that the gas can be diffused on the surface of semiconductor chip 116 uniformly. The gas inlet 1022 is connected with an intake pipe 1024, and connected to a gas supply unit 140 via a control valve 142. The gas supply unit 140 provides the gas for generating the plasma. The control valve 142 can regulate the gas flow rate supplied to the vacuum chamber 102. The gas exit 1024 is connected to a vacuum unit 150 via an exhaust pipe 154, in order to discharge the gas in the vacuum chamber 102.

Figure 2A:
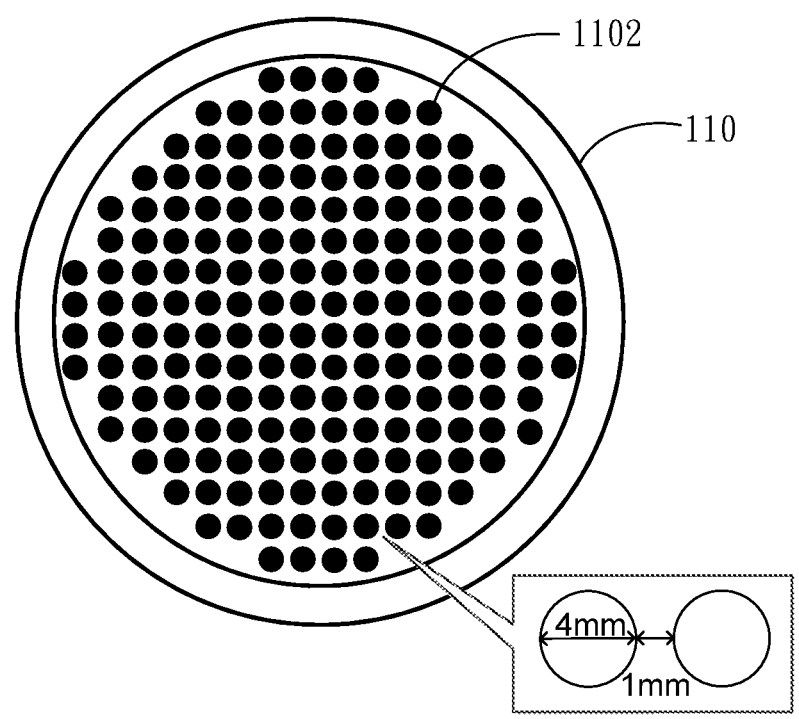
FIG. 2A shows the top view of the first plate in accordance with the plasma processing device of FIG. 1A.
Figure 2B:
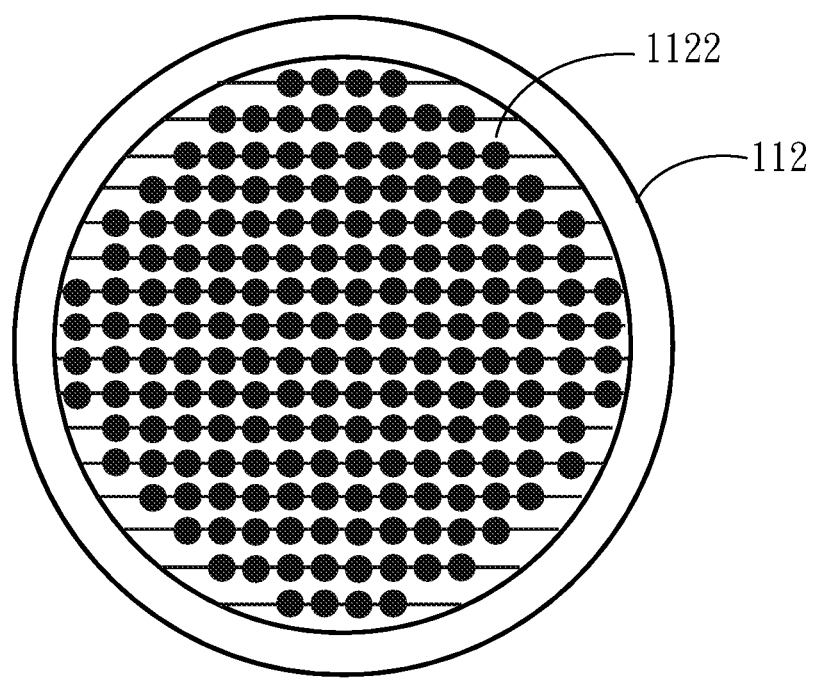
FIG. 2B shows the top view of the second plate in accordance with the plasma processing device of FIG. 1A.
Figure 2C:
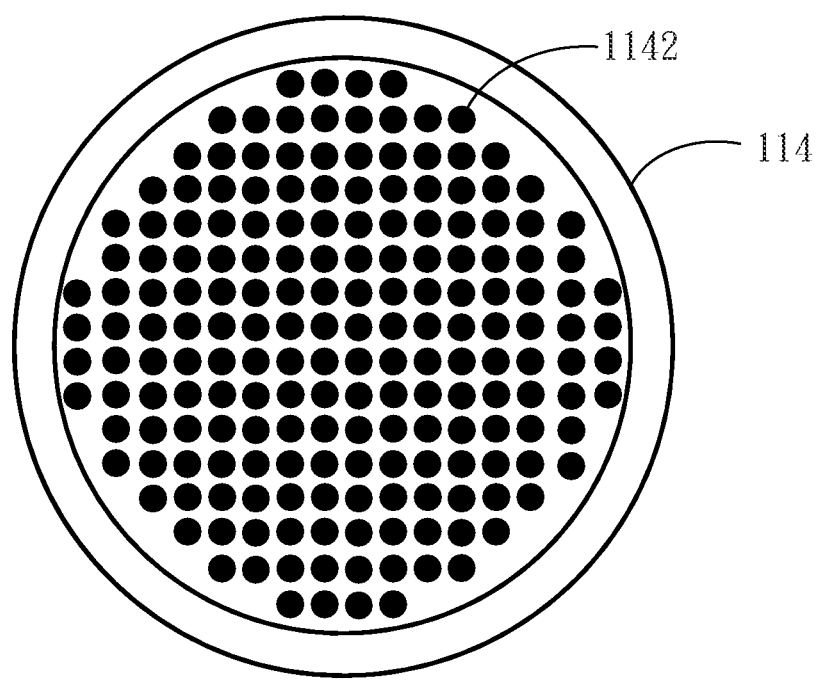
FIG. 2C shows the top view of the third plate in accordance with the plasma processing device of FIG. 1A.

Please refer FIG. 2A, FIG. 2B, and FIG. 2C. FIG. 2A shows the top view of the first plate 110 in accordance with the plasma processing device 100 of FIG. 1A. FIG. 2B shows the top view of the second plate 112 in accordance with the plasma processing device 100 of FIG. 1A. FIG. 2C shows the top view of the third plate 114 in accordance with the plasma processing device 100 of FIG. 1A. In FIG. 2A and FIG. 2B, the white part represents the solid, part, and the black part represents the hollow part. In FIG. 2C, the black part represents the solid part, and the white part represents the hollow part. The first plate 110 includes a plurality of first voids 1102. The second plate 112 includes a plurality of second voids 1122. The third plate 114 includes a plurality of third voids 1142, and the third voids 1142 are placed relative to the first voids 1102. The first plate 110 and the second plate 112 are made up of the insulation material. The insulation material includes the ceramic or quartz. The third plate 114 is made up of the conductive material. The conductive material includes the copper or stainless steel.

In this embodiment, the shape of the first plate 110, the second plate 112 and the third plate 114 is circular, but it is not, limited to this, any shape of plate is also included in the scope of the present invention. Please refer to FIG. 1A. The first plate 110, the second plate 112 and the third plate 114 are placed between the upper electrode 104 and the lower electrode 106. The third plate 114 is placed on the first plate 110 directly. The first plate 110 is placed on the second plate 112 directly. The third voids 1142 are placed relative to the position size of the first voids 1102 totally. The third voids 1142 are staggered with the first voids 1102. When the third plate 114, the first plate 110 and the second plate 112 are overlapped in order, the third voids 1142, the first voids 1102 and the second voids 1122 form a filtration structure, which can be used to filter the plasma 160.

Figure 1B:
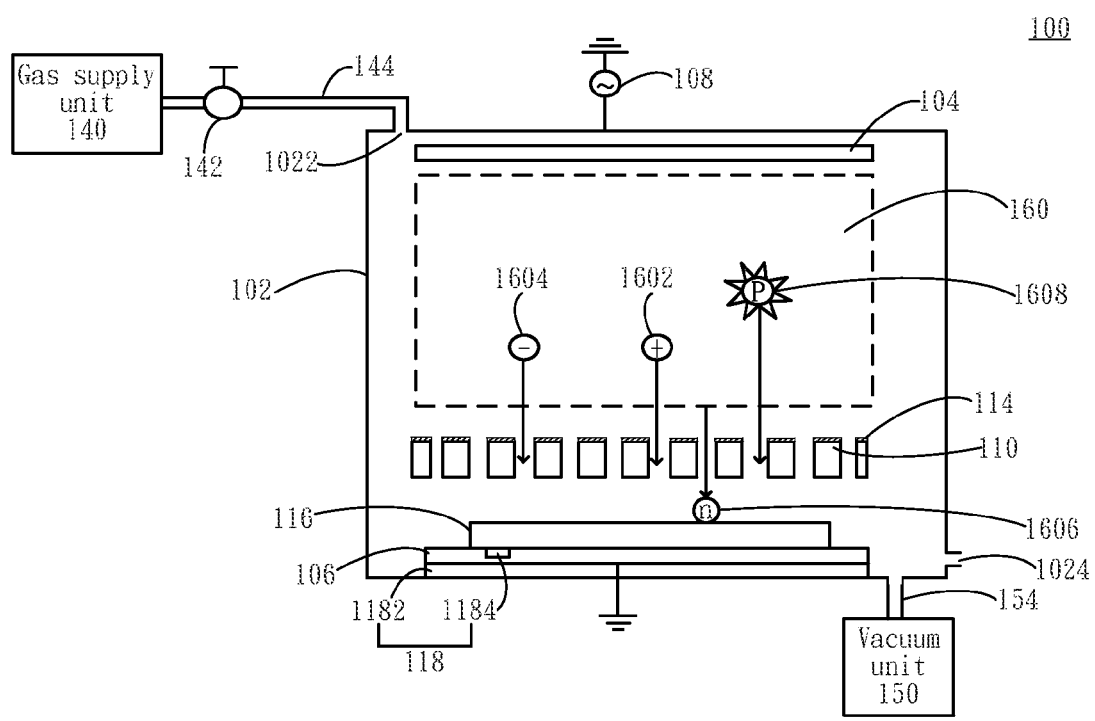
FIG. 1B shows the side view of the plasma processing device in accordance with an embodiment of the present invention.

Please refer to FIG. 1B, which shows another embodiment for the plasma processing device 100 of the present invention. It includes a vacuum chamber 102, an upper electrode 104, a lower electrode 106, a high frequency power unit 108, a first plate 110 and a second plate 112. The first plate 110 and the second plate 112 are placed between the upper electrode 104 and the lower electrode 106.

Please refer FIG. 2A, FIG. 2B, and FIG. 2C. In this embodiment, the shape of the first voids 1102, the second voids 1122 and the third voids 1142 are circular, but other shape of voids is also included in the scope of the present invention. The diameter of the first voids 1102, the second voids 1122 and the third voids 1142 are 4 mm (as the partial magnification part shown in FIG. 2A). The distance between the first voids 1102 and the first voids 1102, the second voids 1122 and the second voids 1122, and the third voids 1142 and the third voids 1142 are 1 mm. The aperture ratio of the first voids 1102, the second voids 1122 and the third voids 1142 relative to the first plate 110, the second plate 112 and the third plate 114 is 50%. It has to describe that the aperture ratio of the first voids 1102, the second voids 1122 and the third voids 1142 are not limited to 50%. Its range is: The aperture ratio of the first voids 1102 relative to the first plate 110 is 25% to 75%. The aperture ratio of the second voids 1122 relative to the second plate 112 is 25% to 75%. The aperture ratio of the third voids 1142 relative to the third plate 114 is 25% to 75%.

When the high frequency power unit 108 provides the high frequency voltage to the upper electrode 104, the plasma 160 is generated between the upper electrode 104 and the lower electrode 106, and there is the glow discharge phenomenon. The working gas provided by the gas supply unit 140 is introduced into the vacuum chamber 102 through the gas inlet 1022, passed through the glow discharge area, and discharged from the gas exit 1024 through the vacuum unit 150 finally.

The plasma 160 includes the positive ion 1602, the negative ion 1604, the free radical 1606, and the ultraviolet (UV) 1608. Because the positive ion 1602, the negative ion 1604, the free radical 1606, and the ultraviolet 1608 will damage the surface of the semiconductor chip 116 and reduce its process yield, thus it is necessary to employ the filtering structure composed of the third voids 1142, the first voids 1102 and the second voids 1122 to filter out the positive ion 1602, the negative ion 1604 and the ultraviolet 1608 from the plasma.

When the plasma 160 passes through the filtering structure composed of the third voids 1142, the first voids 1102 and the second voids 1122, the positive ion 1602, the negative ion 1604 and the ultraviolet 1608 in the plasma 160 will be blocked, and the free radical 1606 is filtered from the plasma 160, which means that only the free radical 1606 can pass through the filtering structure. Finally, the free radical 1606 will carry on the processing of the semiconductor chip 116.

Figure 3A:
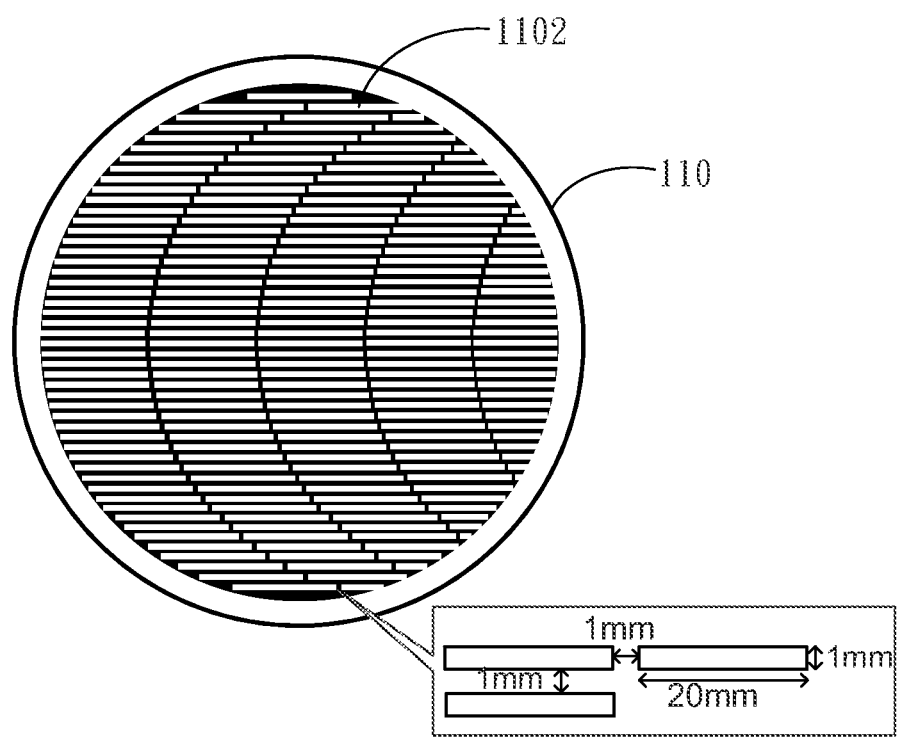
FIG. 3A shows the top view of the first plate in accordance with another embodiment of the present invention.
Figure 3B:
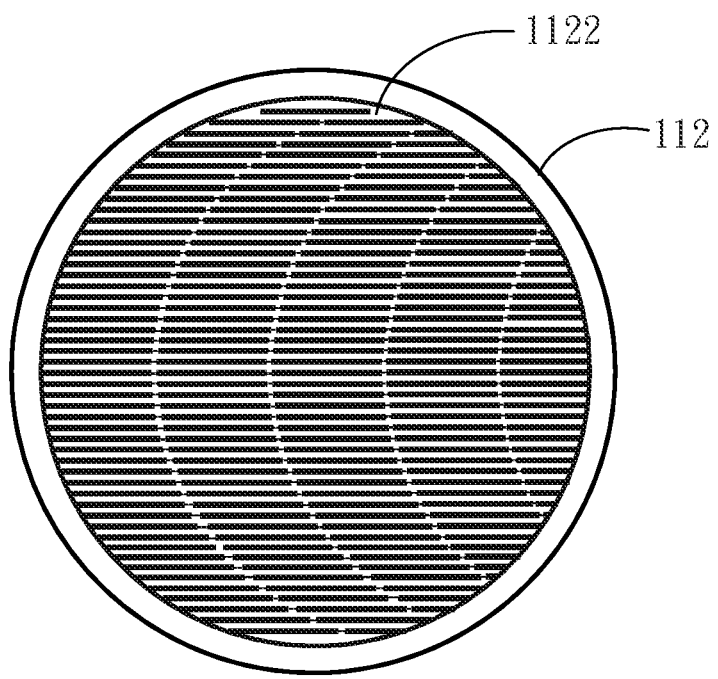
FIG. 3B shows the top view of the second plate in accordance with another embodiment of the present invention.

In another embodiment, please refer to FIG. 3A, FIG. 3B. The shape of the first voids 1102, the second voids 1122 and the third voids 1142 are rectangle. FIG. 3A shows the top view of the first plate 110 in accordance with another embodiment of the present invention. FIG. 3B shows the top view of the second plate 112 in accordance with another embodiment of the present invention. The size of the first voids 1102 and the second voids 1122 is 20 mm long and 1 mm wide. The distance between the first voids 1102 and the first voids 1102, and the second voids 1122 and the second voids 1122 is 1 mm (as the partial magnification part shown in FIG. 3A). The aperture ratio of the first voids 1102, the second voids 1122 and the third voids 1142 relative to the first plate 110, and the second plate 112 is 47.6%.

Figure 4A:
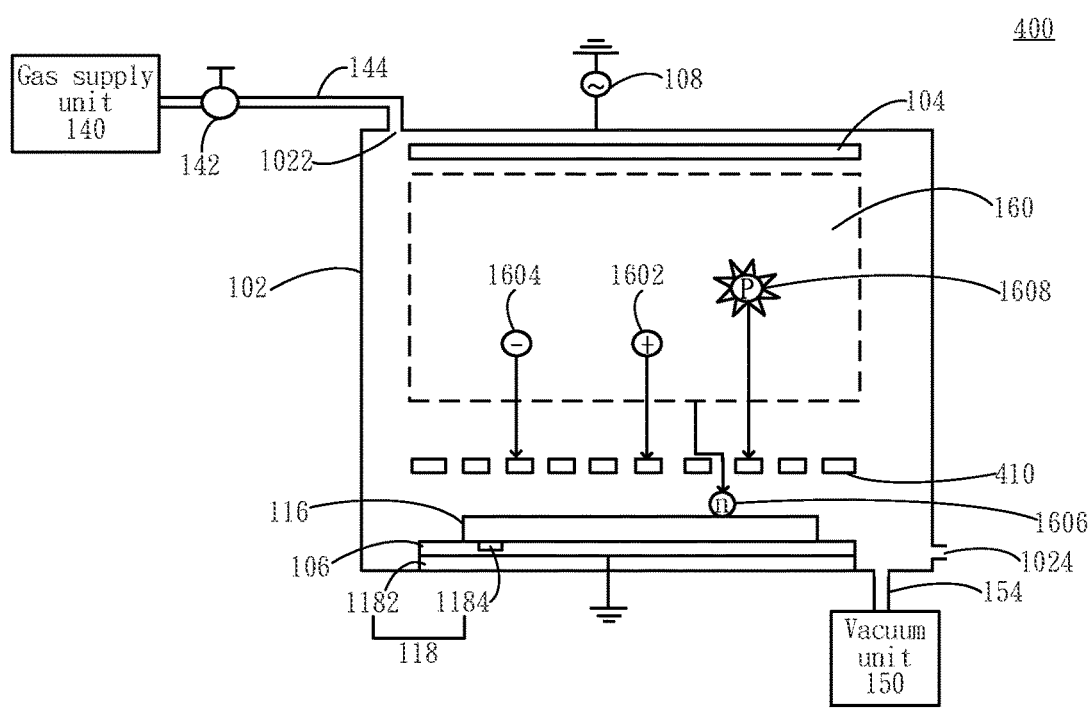
FIG. 4A shows the side view of the plasma processing device in accordance with another embodiment of the present invention.
Figure 4B:
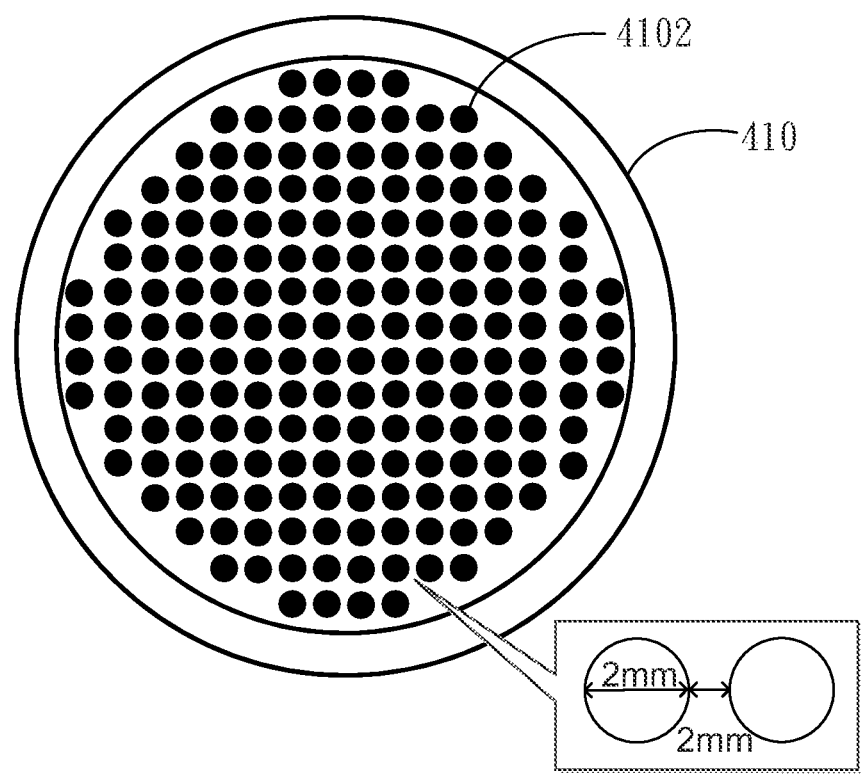
FIG. 4B shows the top view of the first plate in accordance with the plasma processing device of FIG. 4A.

In another embodiment, please refer to FIG. 4A, FIG. 4B. FIG. 4A shows the side view of the plasma processing device in accordance with another embodiment of the present invention. FIG. 4B shows the top view of the first plate 410 in accordance with the plasma processing device 400 of FIG. 4A. In this embodiment, the main difference between the plasma processing device 400 and the plasma processing device 100 of FIG. 1 is that the plasma processing device 400 only has one plate, which is the first plate 410, as shown in FIG. 4A. The structure of the plasma processing device 400 is the single plate structure, which is different from the above-mentioned three-plate structure. As shown in FIG. 4B, the white part represents the solid part, and the black part represents the hollow part. In this embodiment, the shape of the first plate 410 is circular, but it is not limited to this, any shape of plate is also included in the scope of the present invention.

The first plate 410 includes a plurality of first voids 4102. The first plate 410 is made up of the insulation material. The insulation material includes the ceramic or quartz. The aperture ratio of the first voids 4102 relative to the first plate 410 is 25% to 75%. The distance between the first voids 4102 and the first voids 4102 is 2 mm. The diameter of the first voids 4102 is 2 mm. The thickness of the first voids 4102 is 1.0 mm, which is not shown in the Figure. It has to describe that the distance between the first voids 4102 and the first voids 4102 is ranged in 0.1 mm~10 mm. The diameter of the first voids 4102 is also ranged in 0.1 mm~10 mm. The thickness of the first voids 4102 is also ranged in 0.1 mm~10 mm. In this embodiment, the shape of the first voids 4102 is circular, but it is not limited to this, any shape of voids is also included in the scope of the present invention.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A plasma processing device having a vacuum chamber (102), an upper electrode (104), a lower electrode (106), a high frequency power unit (108), a temperature regulation unit (118), a gas supply unit (140), a control valve (142), a gas exit (1024), a gas inlet (1022), and three plates, wherein a first plate (110) is made of quartz and is placed between the upper electrode (104) and the lower electrode (106), a second plate (112) is made of quartz and is placed between the first plate (110) and the lower electrode (106), and a third plate (114) is made of copper and is placed on a surface of the first plate (110), wherein plasma is filtered by a filtration structure composed of a third void (1142), a first void (1102), and a second void (1122), when a filtered plasma being used to process a positive ion (1602), a negative ion (1604), a ultraviolet (1608) in the plasma being blocked, and a free radical (1606) being filtered from the plasma so that the free radical (1606) is carried on for processing of the semiconductor chip, said plasma processing device comprising:

the vacuum chamber (102);
the upper electrode (104) placed in the vacuum chamber (102);
the lower electrode (106) placed in the vacuum chamber (102) relative to the upper electrode (104), a semiconductor chip (116) being placed in the lower electrode (106),
the temperature regulation unit (118), comprising:
a heating unit (1182), and
a temperature measurement unit (1184);
the gas supply unit (140) configured to provide a gas for generating a plasma;
the control valve (142) configured to regulate a gas flow rate supplied to the vacuum chamber (102);
the gas exit (1024), the gas exit (1024) being connected to a vacuum unit (150) via an exhaust pipe (154), in order to discharge the gas in the vacuum chamber (102);
the gas inlet (1022), the gas inlet (1022) being connected with an intake pipe (144), and connected to the gas supply unit (140) via a control valve (142);
the high frequency power unit (108), means for providing a high frequency power to the upper electrode (104) and the lower electrode (106) in the vacuum chamber (102);
wherein the first plate (110) is placed between the upper electrode (104) and the lower electrode (106), and the first plate (110) having a plurality of first voids (1102), wherein the first plate (110) being made of quartz,
an aperture ratio of the first voids (1102) relative to the first plate (110) being 25% to 45%, a distance between a first void (1102) to another first void (1102) is ranged in 0.1 mm~10 mm, a diameter of the first void (1102) is ranged in 0.1 mm~10 mm, a thickness of the first void (1102) is ranged in 0.1 mm~10 mm, wherein a diameter of the first void (1102), the second void (1122), and the third void (1142) is 4 mm;

the second plate (112) made of quartz, placed between the first plate (110) and the lower electrode (106), and the second plate (112) having a plurality of second voids (1122), the aperture ratio of the second voids (1122) relative to the second plate (112) being 25% to 45%; and the third plate (114) placed on a surface of the first plate (110) relative to the upper electrode (104), and the third plate (114) having a plurality of third voids, the third voids (1142) being placed relative to a position size of the first voids (1102), when the third plate (114), the first plate (110) and the second plate (112) being overlapped in order, the third voids (1142), the first voids (1102) and the second voids (1122) form the filtration structure, which is able to be used to filter a plasma, wherein the third plate (114) is made of copper, wherein the second voids (1122) are staggered with the first voids (1102), a shape of the first plate (110) is selected from the group consisting of circle and rectangle, the aperture ratio of the third voids (1142) relative to the third plate (114) being 25% to 45%;

wherein there is a vacuum state inside the vacuum chamber (102), the plasma being generated between the upper electrode (104) and the third plate (114), when the plasma filtered by the plurality of third voids (1142), the plurality of first voids (1102), and the plurality of second voids (1122), the filtered plasma being used to process the semiconductor chip (116), wherein the plasma includes the positive ion (1602), the negative ion (1604), the free radical (1606), and the ultraviolet (1608), wherein when the plasma passes through the filtration structure composed of the third plate (114) made of copper having the third voids (1142), the first plate (110) made of quartz having the first voids (1102) and the second plate (112) made of quartz having the second voids (1122), so that the positive ion (1602), the negative ion (1604) and the ultraviolet (1608) in the plasma is blocked, and the free radical (1606) is filtered from the plasma, the free radical (1606) carry on the processing of the semiconductor chip (116), wherein the free radical (1606) is filtered from the plasma which is used to carry on the etching, washing or membrane deposition of the semiconductor chip (116).

\* \* \* \* \*